United States Patent [19]

Nickel

[11] Patent Number: 5,744,202
[45] Date of Patent: Apr. 28, 1998

[54] ENHANCEMENT OF HYDROGENATION OF MATERIALS ENCAPSULATED BY AN OXIDE

[75] Inventor: Norbert H. Nickel, Berlin, Germany

[73] Assignee: Xerox Corporation, Stamford, Conn.

[21] Appl. No.: 723,749

[22] Filed: Sep. 30, 1996

[51] Int. Cl.$^6$ ................................... C23C 14/14
[52] U.S. Cl. ............... 427/527; 427/404; 427/419.3; 427/529; 427/530; 427/531; 427/535; 427/537; 427/574; 427/576; 427/578; 427/579; 437/937
[58] Field of Search ................... 437/937; 427/527, 427/529, 530, 531, 537, 574, 576, 578, 579, 404, 419.3, 535

[56] References Cited

U.S. PATENT DOCUMENTS

| | | | |
|---|---|---|---|
| 3,442,701 | 5/1969 | Lepselter | 427/531 |
| 3,849,204 | 11/1974 | Fowler | 437/937 |
| 4,359,367 | 11/1982 | Zukotynski et al. | 204/37 R |
| 4,629,514 | 12/1986 | Suda | 148/115 |
| 4,936,781 | 6/1990 | Mircea et al. | 437/24 |
| 4,960,675 | 10/1990 | Tsuo et al. | 430/311 |
| 5,059,551 | 10/1991 | Chevallier et al. | 437/96 |
| 5,194,349 | 3/1993 | Tsuo et al. | 430/21 |
| 5,225,366 | 7/1993 | Yoder | 437/108 |
| 5,250,444 | 10/1993 | Khan et al. | 437/24 |
| 5,527,565 | 6/1996 | Nam et al. | 427/535 |
| 5,534,445 | 7/1996 | Tran et al. | 437/21 |

OTHER PUBLICATIONS

Appl. Phys. Lett. 62 (25), Jun. 1993, American Institute of Physics, N.H. Nickel et al., "Hydrogen passivation of grain boundary defects in polycrystalline silicon thin films", pp. 3285–3287.

Physical Review B, vol. 52, No. 11, Sep. 15, 1995, N.H. Nickel et al., "Hydrogen permeation through thin silicon oxide films", pp. 7791–7794.

*Primary Examiner*—Bernard Pianalto
*Attorney, Agent, or Firm*—Oliff & Berridge, PLC

[57] ABSTRACT

A method for enhancing hydrogenation of oxide-encapsulated materials includes forming an injection layer having a low reflectivity of monatomic hydrogen on an oxide-encapsulated material, and hydrogenating the material with an atomic hydrogen source such as a hydrogen plasma. The method results in a significant decrease in hydrogenation time required to passivate the oxide-encapsulated materials.

12 Claims, 4 Drawing Sheets

ENHANCEMENT OF HYDROGENATION OF MATERIALS ENCAPSULATED BY AN OXIDE

BACKGROUND OF THE INVENTION

1. Field of Invention

The present invention is directed to the hydrogenation of oxide-coated materials such as polycrystalline silicon films and devices using a surface coating with low reflectivity of monatomic hydrogen.

2. Description of Related Art

Polycrystalline silicon ("poly-Si") films are used in a wide variety of devices. For example, poly-Si is used in numerous applications including, but not limited to, thin-film transistors, solar cells, liquid-crystal displays, printers, scanners, and the like.

The reduction of high concentrations of deep and shallow defects in polycrystalline silicon is of great importance to obtain device-grade silicon material having excellent electrical properties. Similarly, defects in materials other than poly-Si that are used in devices requiring excellent electrical properties must also be reduced. In the case of poly-Si, silicon dangling bonds located at silicon grain boundaries and intra-grain defects must be passivated, for example, by bonding them to hydrogen atoms. Commonly, hydrogenation of poly-Si is achieved by exposing poly-Si films to a hydrogen plasma at elevated temperatures (about 200° C. to about 500° C.). However, when poly-Si is incorporated in a device such as a thin-film transistor, the poly-Si layer is encapsulated by an oxide or oxy-nitride film. For some applications, it may be necessary to passivate dopants such as boron, phosphorous, and the like (i.e., hydrogenation of boron doped single or polycrystalline silicon encapsulated by an oxide).

In order to passivate grain-boundary defects in poly-Si devices, hydrogen has to diffuse through numerous layers of oxides, poly-Si, and possible surface barriers, including, but not limited, to gate electrodes, nitride layers, and oxy-nitride layers. The hydrogenation of thin-film transistors is extremely slow due to the presence of these layers. The hydrogenation of thin-film transistors is conducted after the thin-film transistors have been patterned and passivated with an oxide coating because, without the oxide coating, high-temperature processing would drive the hydrogen out from the poly-Si.

Because poly-Si thin-film transistors are commonly hydrogenated through an oxide film, an extremely long hydrogenation time of up to about 16 hours is generally required. This is due to a suppressed hydrogen flux through the oxide layer. A long exposure time is required to achieve full hydrogenation and thus a minimized defect concentration. Consequently, there is a need in the art to reduce the time for the hydrogenation of oxide-encapsulated materials such as polycrystalline silicon films and devices.

SUMMARY OF INVENTION

The present invention relates to a method for the enhanced hydrogenation of oxide-encapsulated materials using a surface coating with low reflectivity of monatomic hydrogen. The present invention provides a method for enhancing the hydrogenation of a material encapsulated by an oxide, comprising forming an injection layer having a low reflectivity of monatomic hydrogen on an oxide-encapsulated material and hydrogenating the material with a hydrogen plasma.

In particular, the present invention relates to a method for the enhanced hydrogenation of oxide-coated materials such as polycrystalline silicon films and devices. The surface coating, or injection layer, results in a significant decrease in hydrogenation time required to passivate such oxide-encapsulated materials.

DETAILED DESCRIPTION OF PREFERRED EMBODIMENTS

The present invention is directed to a process for the enhancement of hydrogenation of oxide-encapsulated materials. The present invention results in a significant decrease in the hydrogenation time required to passivate such oxide-coated materials.

The description of the present invention is directed to specific embodiments using poly-Si. However, the hydrogenation of other materials encapsulated by an oxide including, but not limited to, GaN, poly-diamond, diamond, $C_{60}$, and the like can be enhanced according to the present invention. The following description thus equally applies to such other substrate materials.

In embodiments, a poly-Si material such as a poly-Si film or device is encapsulated by an oxide and coated with an injection layer having low reflectivity of monatomic hydrogen. The material may be encapsulated with an oxide by thermal wet or dry oxide growth, implantation of oxygen into the material, sputtering, deposition, and the like. The oxide-encapsulated layer includes, but is not limited to, $SiO_x$, wherein $1 \leq x \leq 2$. The thickness of the oxide layer is sufficient if it is continuous and has no pin holes. However, hydrogen passivation is inhibited. The present invention overcomes this problem.

Hydrogen concentration profiles in oxides generally cannot be measured accurately by secondary ion mass spectrometry ("SIMS") because of charging of the substrate during sputtering of the oxide layer. To obtain information on hydrogen ("H") and/or deuterium ("D") diffusion through an oxide layer, the underlying material, such as a poly-Si substrate, can be used as a detector. In analysis of embodiments of the present invention, deuterium is used because it is a readily identifiable isotope that duplicates hydrogen chemistry. Thus, D is used to analyze the hydrogenation according to the present invention. Although in practice, hydrogen is preferably used in embodiments of the present invention.

The poly-Si substrate collects the D passing through the oxide and other layers or barriers. The deuterium trapped in the poly-Si substrate is measured using SIMS after the oxide layer is removed. The deuterium, and thus hydrogen, diffusion through the oxide layer is studied by measuring the changes of the D flux through the oxide as a function of hydrogenation time, substrate temperature and oxide thickness.

Figure 1:
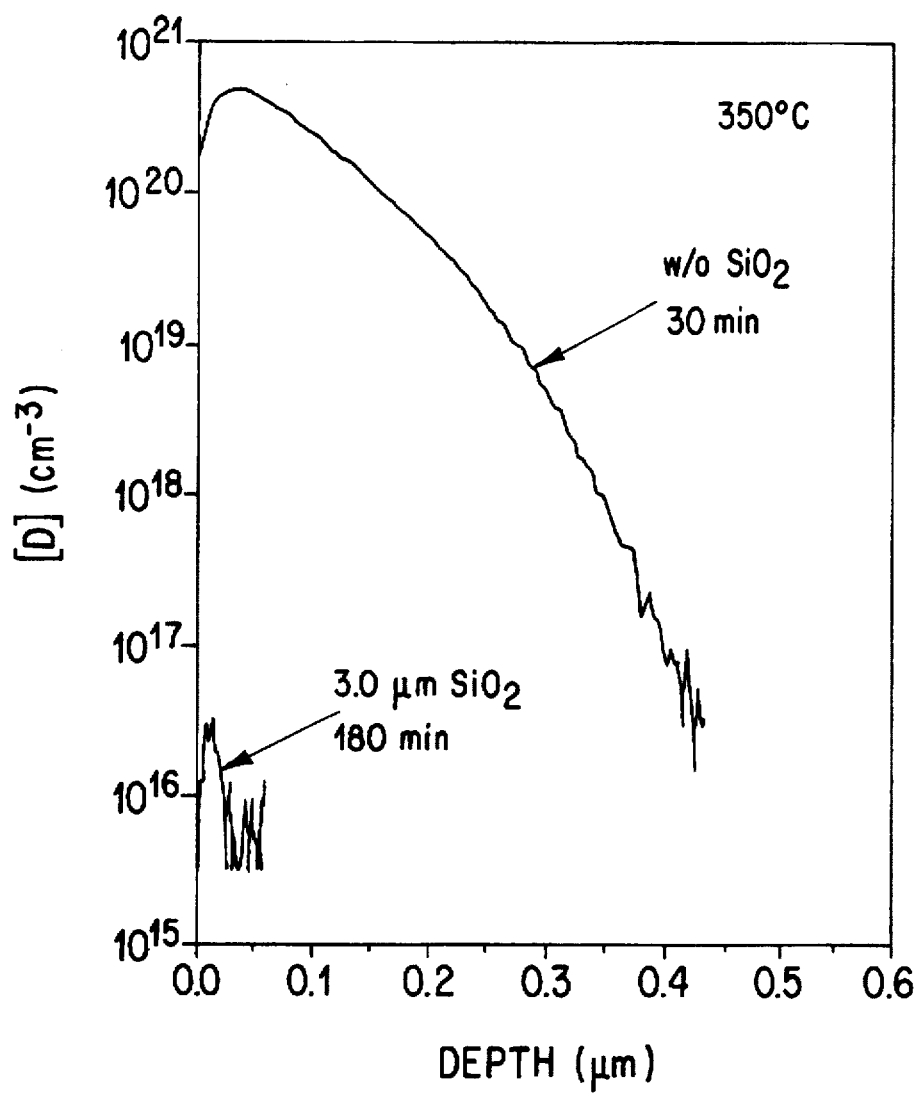
FIG. 1 shows deuterium concentration depth profiles obtained from a poly-Si film with and without a 3.0 µm thick oxide layer.

FIG. 1 shows the influence of an oxide layer on the hydrogenation of a poly-Si film. First, a solid state crystallized poly-Si film with a densified low temperature oxide ("LTO") layer of about 3.0 μm thickness on top is exposed to monatomic deuterium in an optically isolated remote hydrogen microwave plasma at 350° C. for 180 minutes. After the plasma treatment, the LTO layer is removed from the poly-Si film with hydrogen fluoride, HF. Second, a poly-Si film without a LTO layer is exposed to monatomic deuterium in a hydrogen plasma at 350° C. for 30 minutes. The D concentration profiles for both the coated and uncoated poly-Si films are measured by SIMS.

In embodiments of the present invention, a remote hydrogenation system may be used to expose poly-Si films to monatomic deuterium. However, regular plasma hydrogenators and electron cyclotron resonance (ECR) machines may also be employed in other embodiments. The physical limitation of hydrogen passivation is the oxide layer, not the method used to generate the H atoms.

The temperature range for hydrogenation may be between about 200° C. and about 500° C. The time for hydrogenation can be any time suitable to passivate the underlying oxide-encapsulated material. In embodiments, the period of time for hydrogenation is from about 30 minutes to about 180 minutes. A plot of the number of passivated spins as a function of time and temperature appears in Nickel et al., 62 *Appl. Phys. Lett.* 3285 (1993), the entire disclosure of which is incorporated herein by reference. The hydrogen gas, $H_2$, pressure can be any suitable pressure to passivate the underlying oxide-encapsulated material to achieve the objects of the present invention. Preferably, in embodiments, the pressure is about 2.0 Torr.

The influence of the 3.0 μm LTO layer on D incorporation into the poly-Si film is significant. FIG. 1 shows a reduction of the total D flux into the poly-Si due to the presence of the oxide. The D surface concentration decreases from $C_0 = 6.4 \times 10^{20}$ cm$^{-3}$ for the sample without an oxide layer to less than $C_0 = 10^{17}$ cm$^{-3}$ for poly-Si films covered with a 3.0 μm LTO layer. In fact, comparably low D concentrations and depth profiles are also obtained when the LTO layer is only 0.3 μm thick as demonstrated in Nickel et al., 52 *Phys. Rev. B*, 7791 (1995), the entire disclosure of which is incorporated herein by reference. The D concentrations in the poly-Si films are integrated and divided by the hydrogenation time to obtain the average flux.

The D flux for the poly-Si film without an oxide layer is about $F = 10^{12}$ cm$^{-2}$s$^{-1}$. In contrast, the D flux decreases to about $F = 10^8$ to $10^9$ cm$^{-2}$s$^{-1}$ for poly-Si films capped with a LTO thicker than 0.3 μm. The low D flux into the underlying poly-Si film is due to a significant barrier for atomic D or H entering the oxide layer and is not limited by the D or H diffusivity in the oxide.

Minimizing the grain-boundary defects in poly-Si results in a hydrogen concentration that exceeds the defect density of the unpassivated sample by about a factor of 100. In the unpassivated state, solid-state crystallized poly-Si exhibits a spin density of $N_s = 2 \times 10^{18}$ cm$^{-3}$. Hence, a H concentration of approximately $10^{20}$ cm$^{-3}$ is necessary to obtain device-grade poly-Si as described in Nickel et al., 62 *Appl. Phys. Lett.* 3285 (1993), the entire disclosure of which has been incorporated herein by reference.

According to the present invention, a coating (i.e., injection layer) having low reflectivity of monatomic hydrogen is deposited on a material encapsulated with an oxide layer. Low reflectivity means that H or D atoms hitting the coated $SiO_x$ surface enter the injection layer, and subsequently the oxide, and are not reflected back into an atomic hydrogen source, such as a hydrogen plasma. The coating may be deposited by any of the various suitable methods, such as evaporation, sputtering, chemical vapor deposition, molecular beam epitaxy, metallo-organic chemical vapor deposition, and the like. The deposited capping layer may include, but is not limited to, a metal or silicon-based layer. The metal must not be easily oxidized. However, if a metallic oxide is conductive, such as ITO and the like, it may be a suitable injection layer.

Hydrogen prefers metals with a high electron concentration. Hydrogen diffusion from such a metal into an oxide is enhanced for metals with a low H solubility. When using a metal or silicon-based injection layer, hydrogen that diffuses into the injection layer exits primarily through the oxide layer. Thus, according to the present invention, diffusion into the oxide is increased, as is hydrogenation of the underlying material.

In embodiments of the present invention, the deposited injection layer preferably comprises gold (Au), platinum (Pt), hydrogenated amorphous silicon (a-Si:H), poly-Si, silicon on insulator (SOI, e.g., silicon on silicon oxide) or any combination thereof. The deposited coating is of a suitable thickness, preferably in a layer of from about 5 nm to about 7 nm. Although the thickness of the injection layer is not particularly limited, a thin and continuous coating is necessary. A thick coating may increase hydrogenation time and thus passivation time.

As a result of the present invention, the time for the hydrogenation of oxide-encapsulated materials such as poly-Si films and devices is substantially reduced. In addition, the electrical transfer characteristics of poly-Si thin-film transistors are improved, as shown in Table 1 and FIG. 4, described in more detail below.

Specific embodiments of the present invention will now be described in detail with reference to specific examples thereof. These Examples are intended to be illustrative only, and the invention is not limited to the materials, conditions or process parameters set forth in these embodiments.

EXAMPLES

Example 1

A poly-Si film with a 3.0 μm LTO layer is covered with 5 nm of Au. The oxide-coated poly-Si film with the Au injection layer and a control example, a poly-Si film encapsulated by a 3.0 μm thick layer of LTO, are simultaneously exposed to monatomic deuterium generated in an optically isolated remote microwave plasma at 350° C. for 180 minutes.

Figure 2:
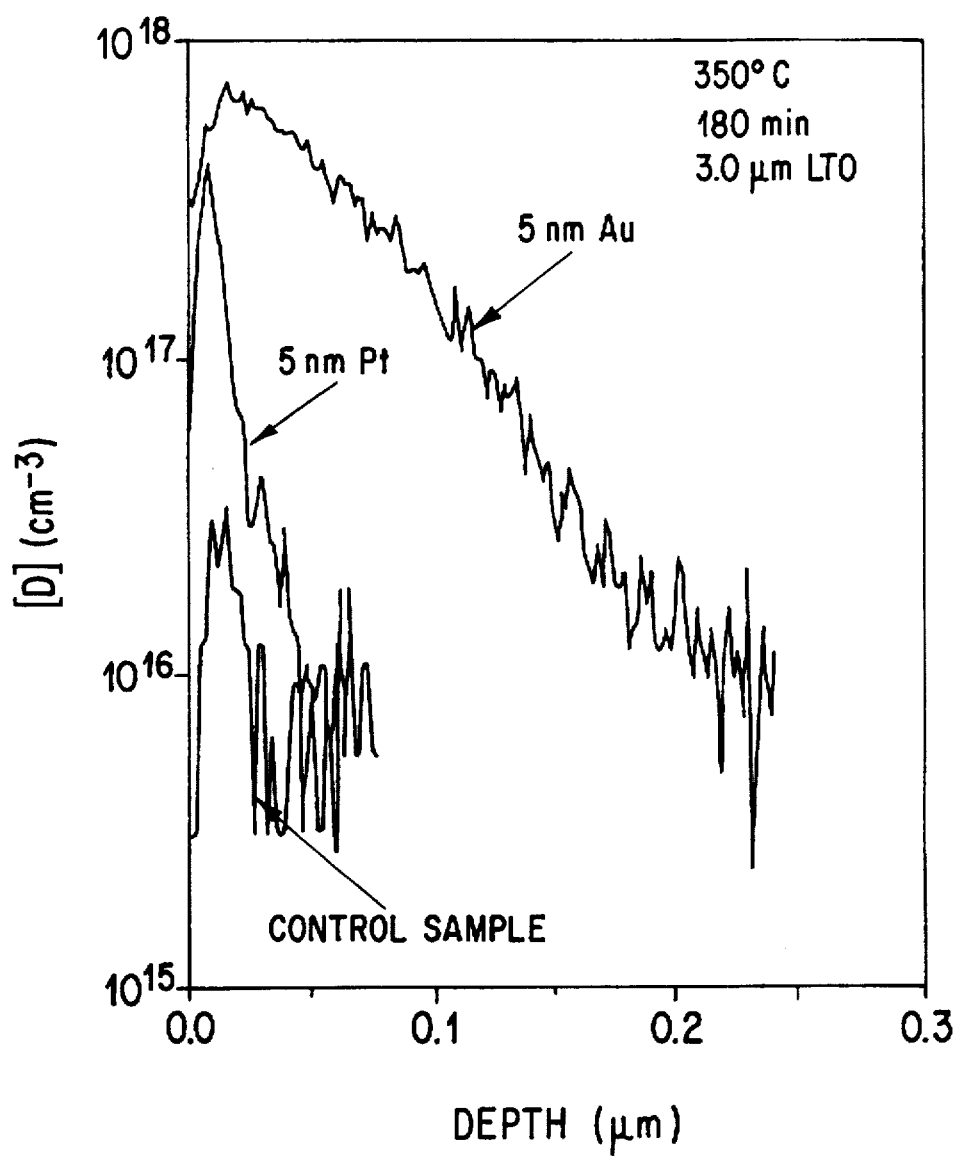
FIG. 2 shows deuterium concentration profiles obtained from a poly-Si film encapsulated with a 3.0 µm thick oxide layer. One sample is uncoated and two samples are coated with a 5 nm thick injection layer of gold or platinum, respectively.

The metal injection layer and oxide layers are removed with HF, and the D concentrations in the underlying poly-Si films are measured by SIMS. FIG. 2 shows the deuterium concentration profiles of the oxide-encapsulated film with an Au injection layer and the control example. A striking increase of the D concentration in the poly-Si is observed due to the presence of the Au injection layer.

The D concentration at the surface of the poly-Si film increases by a factor of about 75 when the LTO is coated with Au. Moreover, D is traced to a depth of about 0.2 μm in the poly-Si film. Thus, an Au injection layer lowers the surface barrier of the LTO and enhances the hydrogenation efficiency of a poly-Si film or device.

Example 2

Five 5 nm of Pt is deposited on a poly-Si film covered with a 3.0 μm thick LTO layer. A control sample of a poly-Si film is covered with a 3.0 μm thick LTO layer, without an intervening Pt layer. Both samples are simultaneously exposed to monatomic deuterium generated in an optically isolated remote plasma at 350° C. for 180 minutes. The metal injection layer and silicon oxide layers are removed with HF, and the D concentrations in the underlying poly-Si films are measured by SIMS. FIG. 2 shows the deuterium concentration profiles of the oxide-encapsulated poly-Si film with a Pt injection layer and the control sample.

FIG. 2 demonstrates that Pt enhances the diffusion of D into the poly-Si film. However, the D concentration is only enhanced close to the poly-Si surface, indicating that Pt lowers the barrier for H incorporation. The lower passivation efficiency is due to the position of the hydrogen chemical potential ($\mu_H$) in the metal. Before hydrogen can diffuse from a metal into underlying oxide and poly-Si layers, $A_H$ has to be increased by filling empty states in the Pt layer with H. Thus, a time delay of the H emission into the LTO layer occurs when using a Pt injection layer as compared to an Au injection layer.

Comparative Example

Figure 3:
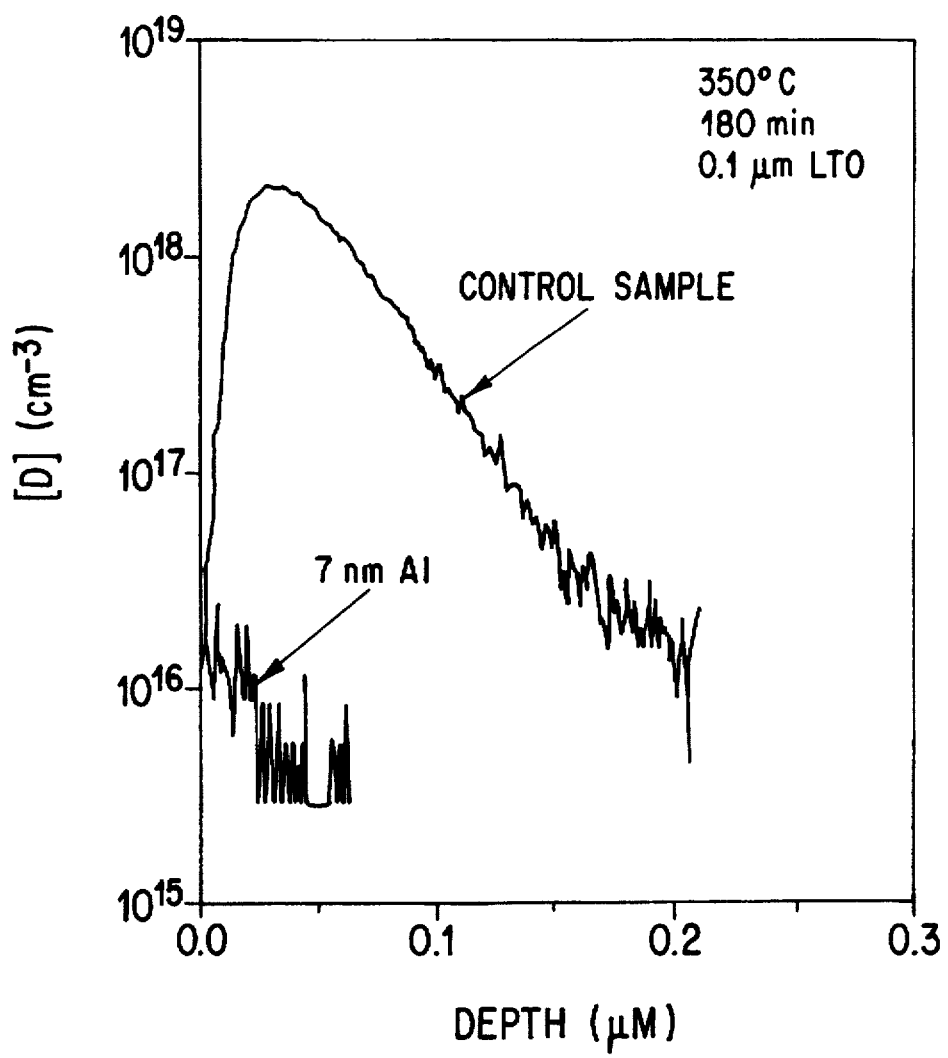
FIG. 3 shows deuterium concentration profiles obtained from a poly-Si film encapsulated with a 0.1 µm thick oxide layer. One sample is uncoated and the other is coated with a 7 nm thick aluminum injection layer.

The effect of an aluminum (Al) injection, or capping, layer on the hydrogenation of a poly-Si film is shown in FIG. 3. Seven nm of Al is deposited on a poly-Si film coated with a 0.1 μm thick LTO (silicon oxide) layer. For comparison, a control sample an oxide-encapsulated poly-Si film without an injection layer, is also prepared.

The Al-capped, oxide-encapsulated poly-Si film and the control sample, are simultaneously exposed to monatomic D at 350° C. for 180 minutes. The metal and silicon oxide layers are removed with HF prior to SIMS measurements. From FIG. 3, it can be seen that Al does not lower the oxide surface barrier for D incorporation.

Metals that form an insulating oxide layer such as Al, which forms $Al_2O_3$, can prevent H atoms from entering the metal and thereby effectively prevent the H passivation process of subsequent layers.

The SIMS results shown in FIGS. 1–3 demonstrate that Au and Pt metal layers enhance the hydrogenation efficiency of oxide-encapsulated materials such as poly-Si films and devices.

Example 3

Top-gate poly-Si thin-film transistor ("TFT") chips encapsulated by a 3.0 μm thick silicon oxide layer are coated with 5 nm Au and 7 nm a-Si:H, respectively. The thin-film transistors are hydrogenated at 350° C. for 30 minutes. For comparison, control samples of similar TFT chips are prepared but without the injection layer.

Figure 4A:
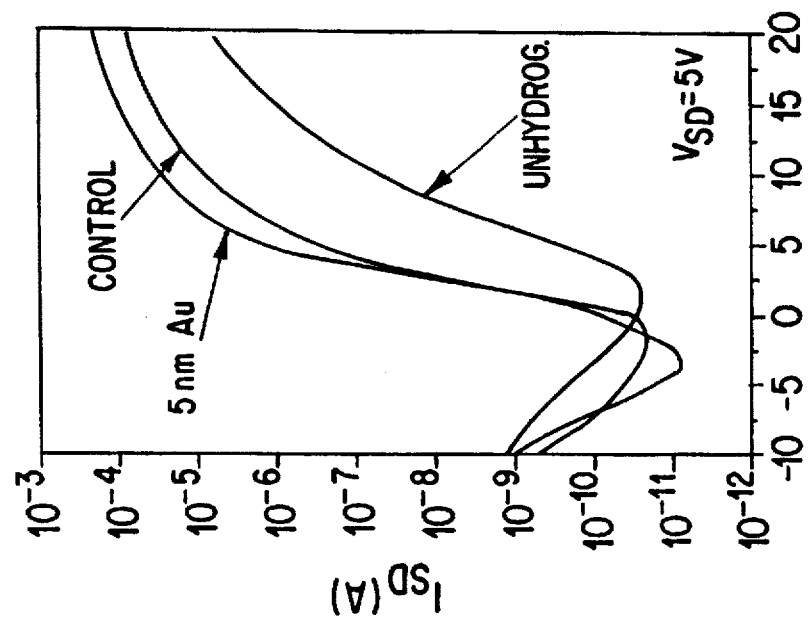
FIG. 4 shows transfer characteristics of oxide-encapsulated polycrystalline silicon thin-film transistors having an injection layer of gold or hydrogenated amorphous silicon after plasma hydrogenation.
Figure 4B:
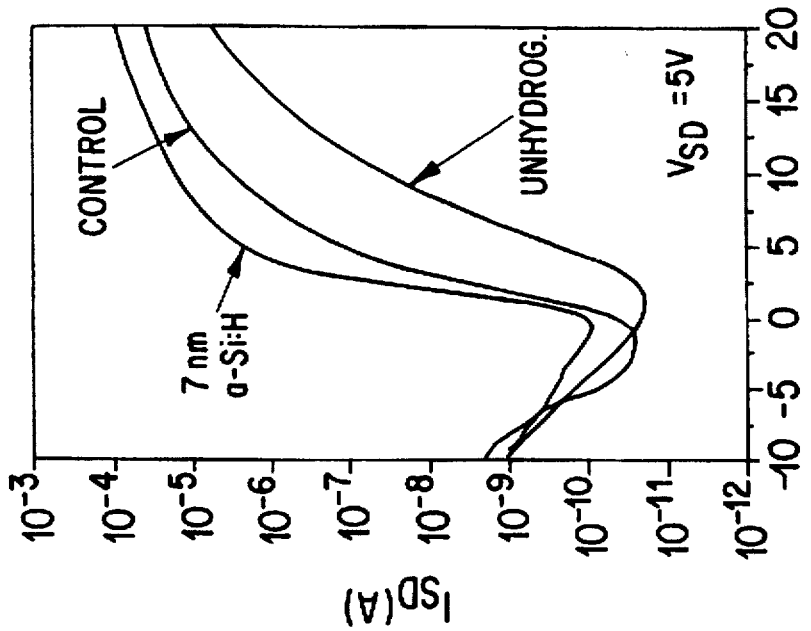

The electrical transfer characteristics prior to and after hydrogenation are shown in FIG. 4 and in Table 1 below. The thin-film transistor chips with the Au and a-Si:H injection layers on top of the LTO exhibit an improved transfer characteristic with respect to the control samples. The pre-threshold slopes improve, the threshold voltages are smaller and the ON currents are higher than the control examples (oxide-encapsulated TFT chips without an injection layer). The pre-threshold slopes of all $I_{SD}$-$V_G$ curves are summarized in Table 1, in which $I_{SD}$ is the source to drain current and $V_G$ is the gate voltage. The source to drain voltage, $V_{SD}$, is 5 volts.

These results demonstrate that Au and a-Si:H are capable of reducing the hydrogenation time of poly-Si devices. Moreover, the a-Si:H is compatible with the poly-Si thin-film transistor fabrication process. It must be emphasized that the hydrogen from the a-Si:H layer is not the source for the hydrogenation of the underlying poly-Si substrate.

TABLE 1

| Pre-threshold slope $\Delta V_G/\Delta I_{SD}$ of the transfer characteristics shown in Figure 4. | |
|---|---|
| TFT | $\Delta V_G/\Delta I_{SD}$ |
| (a) unpassivated | 0.9 |
| control | 0.56 |
| Au injection layer | 0.38 |
| (b) unpassivated | 0.9 |
| control | 0.55 |
| a:Si—H injection layer | 0.31 |

The invention has been described with references to particular embodiments. Modifications and alterations will be apparent to those skilled in the art upon reading and understanding this specification. It is intended that all such modifications and alterations are included insofar as they come within the scope of the appended claims.

What is claimed is:

1. A method for enhancing the hydrogenation of a material encapsulated by an oxide, comprising:
   forming an injection layer selected from the group consisting of Au and Pt on an oxide-encapsulated material; and
   hydrogenating said material with an atomic hydrogen source such as a hydrogen plasma.

2. The method for enhancing hydrogenation according to claim 1, wherein said material is selected from the group consisting of GaN, $C_{60}$, poly-diamond, diamond and polycrystalline silicon.

3. The method for enhancing hydrogenation according to claim 1, wherein said material is a polycrystalline silicon film or device.

4. The method for enhancing hydrogenation according to claim 1, wherein said oxide comprises an oxide represented by the formula $SiO_x$, wherein $1 \leq x \leq 2$.

5. The method for enhancing hydrogenation according to claim 1, wherein said injection layer is from about 5 to about 7 nm thick.

6. The method for enhancing hydrogenation according to claim 1, wherein said injection layer is deposited by evaporation, sputtering, chemical vapor deposition, molecular beam epitaxy or metallo-organic chemical vapor deposition.

7. The method for enhancing hydrogenation according to claim 1, wherein said hydrogenating occurs at a temperature of about 200° C. to about 500° C.

8. The method for enhancing hydrogenation according to claim 1, wherein said hydrogenating is conducted for a period of time from about 30 minutes to about 180 minutes.

9. A polycrystalline silicon device prepared by a process comprising:
   forming an oxide on a polycrystalline silicon substrate;
   forming an injection layer selected from the group consisting of Au and Pt on said oxide; and
   hydrogenating said silicon substrate with an atomic hydrogen source such as a hydrogen plasma.

10. A method for enhancing the hydrogenation of a polycrystalline silicon film, comprising:

forming an oxide layer on said polycrystalline silicon film;

forming an injection layer selected from the group consisting of Au and Pt and mixtures thereof on said oxide layer; and hydrogenating said film with an atomic hydrogen source such as a hydrogen plasma.

11. The method for enhancing hydrogenation according to claim 1, wherein said hydrogenating is through diffusion.

12. A method for enhancing the hydrogenation of a material encapsulated by an oxide, comprising:

forming an injection layer selected from the group consisting of Au and Pt on an oxide-encapsulated material; and diffusing monatomic hydrogen into said injection layer and through said oxide, thereby hydrogenating said material.

* * * * *

UNITED STATES PATENT AND TRADEMARK OFFICE
CERTIFICATE OF CORRECTION

PATENT NO. : 5,744,202
DATED      : April 28, 1998
INVENTOR(S) : Norbert H. NICKEL and Jack WALKER It is certified that error appears in the above-identified patent and that said Letters Patent is hereby corrected as shown below:

Please change "[75] Inventor:  Norbert H. Nickel, Berlin, Germany"

to --[75] Inventor:  Norbert H. Nickel, Berlin, Germany;
                    Jack Walker, Sunnyvale, California--

Signed and Sealed this

Ninth Day of March, 1999

Attest:

Q. TODD DICKINSON

*Attesting Officer*     *Acting Commissioner of Patents and Trademarks*